United States Patent
Su et al.

(10) Patent No.: US 11,744,013 B2
(45) Date of Patent: Aug. 29, 2023

(54) COMPOSITE, HIGH-FREQUENCY CIRCUIT SUBSTRATE PREPARED THEREFROM AND PROCESS FOR PREPARING THE SAME

(71) Applicant: SHENGYI TECHNOLOGY CO., LTD., Guangdong (CN)

(72) Inventors: Minshe Su, Guangdong (CN); Duye Li, Guangdong (CN); Shanyin Yan, Guangdong (CN); Qianfa Liu, Guangdong (CN); Zhongqiang Yang, Guangdong (CN)

(73) Assignee: SHENGYI TECHNOLOGY CO., LTD.

( * ) Notice: Subject to any disclaimer, the term of this patent is extended or adjusted under 35 U.S.C. 154(b) by 685 days.

(21) Appl. No.: 15/841,439

(22) Filed: Dec. 14, 2017

(65) Prior Publication Data
US 2018/0263115 A1 Sep. 13, 2018

(30) Foreign Application Priority Data
Mar. 10, 2017 (CN) .......................... 201710142130.2

(51) Int. Cl.
| H05K 1/03 | (2006.01) |
| B32B 17/02 | (2006.01) |
| B32B 25/16 | (2006.01) |
| B32B 5/26 | (2006.01) |
| C08J 5/24 | (2006.01) |
| H05K 1/02 | (2006.01) |

(52) U.S. Cl.
CPC ............. *H05K 1/0373* (2013.01); *B32B 5/26* (2013.01); *B32B 17/02* (2013.01); *B32B 25/16* (2013.01); *C08J 5/244* (2021.05); *C08J 5/249* (2021.05); *H05K 1/0237* (2013.01); *H05K 1/0366* (2013.01); *B32B 2262/101* (2013.01); *B32B 2307/204* (2013.01); *C08J 2300/24* (2013.01); *C08J 2325/10* (2013.01); *C08J 2400/26* (2013.01); *C08J 2423/16* (2013.01); *H05K 2201/0154* (2013.01); *H05K 2201/0278* (2013.01); *H05K 2201/068* (2013.01)

(58) Field of Classification Search
CPC ........... B32B 5/26; B32B 17/02; B32B 25/16; B32B 2307/204; B32B 2262/101; H05K 1/0237; H05K 1/0366; H05K 1/0373; H05K 2201/0154; H05K 2201/0278; H05K 2201/068; C08J 5/24; C08J 2325/10; C08J 2400/26; C08J 2423/16; C08J 2300/24

See application file for complete search history.

(56) References Cited

U.S. PATENT DOCUMENTS

| 6,048,807 A * | 4/2000 | Landi ........................ C08L 9/00 442/173 |
| 6,291,374 B1 | 9/2001 | Landi |
| 2003/0075270 A1* | 4/2003 | Landi ..................... H05K 3/386 156/334 |
| 2006/0246294 A1 | 11/2006 | Landi |
| 2014/0107256 A1* | 4/2014 | Su ........................... C08L 35/06 523/439 |
| 2016/0177082 A1* | 6/2016 | Liao .......................... C08J 5/24 428/457 |

FOREIGN PATENT DOCUMENTS

EP 1930371 A1 11/2008

OTHER PUBLICATIONS

Easterbrook E.K., Allen R.D. (1999) Ethylene-Propylene Rubber. In: Morton M. (eds) Rubber Technology. Springer, Dordrecht (Year: 1999).*
European Search Report dated May 5, 2018; EP Application No. 17208581.

* cited by examiner

*Primary Examiner* — Samir Shah
(74) *Attorney, Agent, or Firm* — McDonald Hopkins LLC

(57) ABSTRACT

The present invention relates to a composite, a high-frequency circuit substrate prepared therefrom and a process for preparing the same. Such composite includes (1) from 20 to 70 parts by weight of a thermosetting mixture, including (A) a thermosetting resin based on polybutadiene or a copolymer resin of polybutadiene and styrene having a molecular weight of 11,000 or less, being composed of carbon and hydrogen elements and containing 60% or more of vinyl groups, and (B) an ethylene-propylene rubber having a weight-average molecular weight of greater than 100,000 and less than 150,000 and a number-average molecular weight of greater than 60,000 and less than 100,000 and being in a solid state at room temperature; (2) from 10 to 60 parts by weight of a glass fiber cloth; (3) from 0 to 70 parts by weight of a powder filler; and (4) from 1 to 3 parts by weight of a curing initiator. The composite of the present invention has good solvent solubility and good process operability. The high-frequency circuit substrate made by using the composite has good high frequency dielectric properties and better thermal oxidative aging performance.

13 Claims, No Drawings

COMPOSITE, HIGH-FREQUENCY CIRCUIT SUBSTRATE PREPARED THEREFROM AND PROCESS FOR PREPARING THE SAME

TECHNICAL FIELD

The present invention relates to the technical field of high molecular materials, specifically to a composite, a high-frequency circuit substrate prepared therefrom and a process for preparing the same, especially to a thermosetting dielectric composite, a high-frequency circuit substrate prepared therefrom and a process for preparing the same.

BACKGROUND ART

In recent years, with the development of high performance, high functionality and networkization of information communication equipments, the operation signal tends to high frequency in order to transmit and deal with large capacity information, and thus the requirements for the circuit substrate material are put forward.

Among the materials used for printed circuit substrates, epoxy resin having excellent adhesive property is widely applied. However, the epoxy resin circuit substrate generally has a higher dielectric constant and a higher dielectric loss tangent (a dielectric constant of more than 4, and a dielectric loss tangent of 0.02 or so), and insufficient high frequency characteristics, so that it cannot meet the requirements on high frequency signal. Therefore, it is necessary to develop a resin having excellent dielectric properties, i.e. a resin having a low dielectric constant and a low dielectric loss tangent. For a long time, those skilled in the art have studied the thermosetting polybutadiene or copolymer resin of polybutadiene and styrene with good dielectric properties, and the following research results are further discussed below.

WO9738564A1 discloses a composite insulating material which uses a non-polar styrene and a tetramer of butadiene and divinylbenzene added with a magnesium aluminosilicate filler, and a glass fiber cloth as a reinforcing material to form a circuit substrate. Although the dielectric properties thereof are excellent, the substrate has a worse heat resistance. The glass transition temperature thereof is only about 100° C.; the coefficient of thermal expansion thereof is too large to meet the high temperature (240° C. or higher) requirements on the lead-free process of the PCB production process.

U.S. Pat. No. 5,571,609A discloses a thermosetting composition based on polybutadiene and polyisoprene, and discloses composing 1,2-polybutadiene resin or polyisobutadiene having a small molecular weight of less than 5000 with a copolymer of butadiene and styrene having a high molecular weight, adding a large amount of silica powder as a filler, and a glass fiber cloth as a reinforcing material to prepare circuit substrates. Although the dielectric properties thereof are excellent, the process performance of the process of producing the prepreg is deteriorated since a copolymer of butadiene and styrene is used to crosslink to improve the sticky condition of the prepreg. Moreover, because the benzene ring having a rigid structure has a small proportion in the resin molecule of the whole resin system, and the crosslinked chain segments are made of methylene having a very low rigidity, the prepared plates have a worse rigidity and a very low bending strength.

U.S. Pat. No. 6,569,943B2 discloses a copolymer of a vinyl-terminated polybutadiene and butadiene-styrene containing a carbamate and/or ester residue and a circuit substrate made therefrom, and reveals using an amine-modified liquid polybutadiene resin having vinyl group at the end of the molecule, adding monomers having a low molecular weight as a curing agent and a diluent, impregnating glass fiber cloth to prepare circuit substrate.

Although the dielectric properties thereof are good, it is difficult to apply the common stacking process of prepregs, and the process operation is more difficult during the compression molding of the plates, since the resin system is liquid at room temperature, and cannot be made into non-sticky prepregs.

In addition, since the operating temperature of the high-frequency communication apparatus is in the range of −60° C. to 150° C., this is a higher requirement for the long-term thermal aging performance of the high-frequency circuit substrate. According to the UL requirements, high-frequency circuit substrate shall be required to work at a certain temperature for 100,000 hours, and the performance retention rate of the bending strength and dielectric strength (or breakdown voltage) thereof shall be more than 50%. Such temperature point is set as the long-term thermal aging index (RTI) of materials. This brings a great challenge to the thermosetting resins based on polybutadiene or copolymer resins of polybutadiene and styrene how to improve the long-term thermal aging index of high-frequency circuit substrates.

U.S. Pat. Nos. 6,048,807A and 6,291,374B1 both disclose a thermosetting composition based on polybutadiene and polyisoprene, and disclose improving the long-term retention rate of the bending strength and dielectric strength by adding a liquid ethylene-propylene rubber having a weight-average molecular weight of less than 50,000 in a high-frequency circuit substrate. However, the high-frequency circuit substrate produced thereby is poor in thermal aging performance.

U.S. Pat. No. 5,504,136A discloses an adhesive tape composition comprising at least two ethylene-propylene diene methylene rubbers and a binder reinforcing polymer selected from the group consisting of polyisoprene, polybutadiene and ethylene-propylene copolymers and mixtures thereof, wherein at least one of said ethylene-propylene diene methylene rubbers has a weight-average molecular weight of at least about 150,000, and at least another rubber has a weight-average molecular weight of at most about 125,000. Said adhesive tape composition is used to adhere the edges of two layers of roof rubber sheets to each other.

Although the adhesive tape composition provides excellent long-term thermal aging performance, the applied field is the field of roof adhesive materials. It does not give a technical inspiration on how to improve the thermal aging performance of high-frequency circuit substrates in the circuit board field.

Therefore, it becomes a current research focus how to improve the components of the thermosetting composition so as to make it have a good solubility and thus facilitate the operation of the process, and to make the prepared high-frequency circuit substrates have better high-frequency dielectric properties and better thermal aging performance.

At present, the related research on ethylene-propylene rubber shows that, when ethylene-propylene rubber is added into the thermosetting resin for the production of circuit substrates, the composite and the circuit substrates produced thereby have better thermal oxidative aging performance with the increase of the weight-average molecular weight. However, with the increase of the weight-average molecular weight, it will lead to the decrease of the solubility of the material, the deterioration of the process operability, and the difficulty in making the prepreg. Therefore, it is an urgent problem to be solved how to choose the weight-average molecular weight of ethylene-propylene rubber, so as to ensure not only good thermal oxidative aging performance, but also a good solubility.

DISCLOSURE OF THE INVENTION

In order to solve the deficiencies of the prior art, the object of the present invention is to provide a composite, a high-frequency circuit substrate prepared therefrom, and a process for preparing the same. The composite provided by the present invention has good solvent solubility and better process operability, so that the prepreg is easy to be made. The high-frequency circuit substrate prepared by using the composite has good high frequency dielectric properties and better thermal oxidative aging performance.

According to the object of the present invention above, the present invention discloses a composite comprising the following components:
(1) from 20 to 70 parts by weight of a thermosetting mixture, comprising:
(A) a thermosetting resin based on polybutadiene or a copolymer resin of polybutadiene and styrene having a molecular weight of 11,000 or less, being composed of carbon and hydrogen elements and containing 60% or more of vinyl groups, and
(B) an ethylene-propylene rubber having a weight-average molecular weight of greater than 100,000 and less than 150,000 and a number-average molecular weight of greater than 60,000 and less than 100,000 and being in a solid state at room temperature;
(2) from 10 to 60 parts by weight of a glass fiber cloth;
(3) from 0 to 70 parts by weight of a powder filler; and
(4) from 1 to 3 parts by weight of a curing initiator.

Into the composite is added an ethylene-propylene rubber having a weight-average molecular weight of greater than 100,000 and less than 150,000 and a number-average molecular weight of greater than 60,000 and less than 100,000 and being in a solid state at room temperature, which can notably improve the long-term thermal oxidative aging performance of the composite and high-frequency circuit substrate. Moreover, such material has better solvent solubility and good process operability.

Meanwhile, the present invention further discloses a laminate prepared from the composite above, comprising a plurality of layers of superimposed prepregs, each of which is made of the composite.

Meanwhile, the present invention further discloses a high-frequency circuit substrate prepared from the composite above, comprising a plurality of layers of superimposed prepregs and copper foils pressed on both sides thereof, wherein each of the prepregs is made of the composite.

The high-frequency circuit substrate prepared from the composite of the present invention has good high frequency dielectric properties. Its dielectric constant (10 GHz) can be as low as 3.6 or less, and the dielectric loss tangent (10 GHz) can reach 0.005 or less. It has better thermal oxidative aging performance, and an oxidation induction time of 20 min or more at the temperature of 170° C. and an oxidation induction time of 12 min or more at the temperature of 210° C., and an oxidation induction time of 2 min or more at the temperature of 230° C.

In addition, the present invention discloses a process for preparing the high-frequency circuit substrate, comprising the following steps, Step I weighing the following components of the composite,
(1) from 20 to 70 parts by weight of a thermosetting mixture, comprising:
(A) a thermosetting resin based on polybutadiene or a copolymer resin of polybutadiene and styrene having a molecular weight of 11,000 or less, being composed of carbon and hydrogen elements and containing 60% or more of vinyl groups; and
(B) an ethylene-propylene rubber having a weight-average molecular weight of greater than 100,000 and less than 150,000 and a number-average molecular weight of greater than 60,000 and less than 100,000 and being in a solid state at room temperature;
(2) from 10 to 60 parts by weight of a glass fiber cloth;
(3) from 0 to 70 parts by weight of a powder filler; and
(4) from 1 to 3 parts by weight of a curing initiator;

Step II mixing the weighed thermosetting mixture, powder filler and curing initiator, diluting with a solvent to a suitable viscosity, homogeneously stirring and mixing to make the powder filler dispersed in the thermosetting resin homogeneously to obtain a glue solution, impregnating the glass fiber cloth with the glue solution, controlling to a suitable thickness, and then removing the solvent to form a prepreg;

Step III laminating a plurality of said prepregs, pressing a copper foil on the upper and bottom side thereof respectively, curing in a press at a curing temperature of 150° C.-300° C. and a curing pressure of 25 kg/cm²-70 kg/cm², to obtain the high-frequency circuit substrate.

As compared to the prior art, the present invention has at least the following beneficial effects.

(1) The present invention discloses improving the long-term thermal oxidative aging performance of the composite or high-frequency circuit substrate by using an ethylene-propylene rubber having a weight-average molecular weight of more than 100,000 and less than 150,000 and having a number-average molecular weight of more than 60,000 and less than 100,000. Moreover, the material has good solvent solubility, good process operability, so that the prepreg is easy to prepare.

(2) The present invention discloses preparing the high-frequency circuit substrate by using the composite comprising an ethylene-propylene rubber having a weight-average molecular weight of more than 100,000 and less than 150,000, having a number-average molecular weight of more than 60,000 and less than 100,000 and being in a solid state at room temperature. It has good high frequency dielectric properties. Its dielectric constant (10 GHz) can be as low as 3.6 or less, and the dielectric loss tangent (10 GHz) can reach 0.005 or less. It has better thermal oxidative aging performance, and an oxidation induction time of 20 min or more at the temperature of 170° C. and an oxidation induction time of 12 min or more at the temperature of 210° C., and an oxidation induction time of 2 min or more at the temperature of 230° C.

(3) The present invention discloses using a thermosetting resin based on polybutadiene or a copolymer resin of polybutadiene and styrene, being composed of carbon and hydrogen elements and containing 60% or more of vinyl groups, crosslinking via a large amount of unsaturated double bonds in the resin to provide the circuit substrates with required high-frequency dielectric properties and high temperature resistance.

Embodiments

The embodiments of the present invention are detailedly stated as follows.

I. Components of the Composite

1. Thermosetting Mixture Resin System

The first component of the composite of the present invention is a thermosetting mixture having a weight of from 20 to 70 parts by weight based on the total weight of the components of the composite (based on the total weight parts of the composite), e.g. 20, 22, 23, 25, 28, 30, 32, 35, 40, 42, 45, 48, 50, 52, 55, 57, 60, 62, 65, 68 or 70 parts by weight, as well as the specific point values between the above values. Due to space limitation and for concise consideration, the present invention is not intended to exhaust the specific point values included in the range of the present invention. Preferably, the thermosetting mixture is in an amount of from 20 to 50 parts by weight of the total weight of the components of the composite.

The thermosetting mixture of the present invention comprises the following components:

(A) a thermosetting resin based on polybutadiene or a copolymer resin of polybutadiene and styrene having a molecular weight of 11,000 or less, being composed of carbon and hydrogen elements and containing 60% or more of vinyl groups, and (B) an ethylene-propylene rubber having a weight-average molecular weight of greater than 100,000 and less than 150,000 and a number-average molecular weight of greater than 60,000 and less than 100,000 and being in a solid state at room temperature.

In the present invention, the ethylene-propylene rubber has a weight-average molecular weight of greater than 100,000 and less than 150,000 and a number-average molecular weight of greater than 60,000 and less than 100,000.

As compared to ethylene-propylene rubbers having a weight-average molecular weight of greater than 150,000 and a number-average molecular weight of greater than or equal to 100,000, the ethylene-propylene rubber within the range of the aforesaid weight-average molecular weight has better solvent solubility, is beneficial to the impregnating process during the preparation of the composite, has good process operability, makes it easy to prepare prepregs, wherein the solvents which may be enumerated include benzene such as toluene and the like. The ethylene-propylene rubbers having a weight-average molecular weight of greater than 150,000 has a worse solubility in the solvents, cannot achieve resin glue solution having a better solubility, so as to affect the impregnating process of the composite and the homogeneity of the finished products. As compared to ethylene-propylene rubbers having a weight-average molecular weight of less than or equal to 50,000, it can make the prepared high-frequency circuit substrate have more excellent thermal oxidative aging performance and better high frequency dielectric properties. When the ethylene-propylene rubber has a weight-average molecular weight of greater than 50,000 and less than or equal to 100,000, or a number-average molecular weight of less than or equal to 60,000, it cannot achieve the thermal oxidative aging performance expected in the present invention either.

Therefore, the present invention achieves the optimum effects of the process operability and thermal oxidative aging resistance by controlling the weight-average molecular weight of greater than 100,000 and less than 150,000 and a number-average molecular weight of greater than 60,000 and less than 100,000. Moreover, such effects are not known in advance in the art.

The ethylene-propylene rubber component of the present invention refers to the ethylene-propylene rubber which is in a solid state at room temperature. As compared to the current liquid ethylene-propylene rubber, the ethylene-propylene rubber which is in a solid state at room temperature can improve the thermal oxidative aging performance of the high-frequency circuit substrates to the maximum extent. Specifically, when the ethylene-propylene rubber which is in a solid state at room temperature is used, the high-frequency circuit substrates have an oxidation induction time of 21 min at 170° C.; when the ethylene-propylene rubber which is in a liquid state at room temperature is used, the high-frequency circuit substrates have an oxidation induction time of only 10 min at 170° C. When the ethylene-propylene rubber which is in a solid state at room temperature is used, the high-frequency circuit substrates have an oxidation induction time of 13 min at 190° C.; when the ethylene-propylene rubber which is in a liquid state at room temperature is used, the high-frequency circuit substrates have an oxidation induction time of only 6 min at 190° C.

As compared to other types of rubbers such as styrene-butadiene rubber, butadiene rubber, isoprene rubber and neoprene, the present invention discloses that, by using ethylene-propylene rubber, the prepared high-frequency circuit substrates can have better high frequency dielectric properties and achieve better thermal oxidative aging performance.

The component B of the present invention needs to satisfy the following three factors: (1) using an ethylene-propylene rubber; (2) using an ethylene-propylene rubber which is in a solid state at room temperature; (3) using an ethylene-propylene rubber having a weight-average molecular weight of greater than 100,000 and less than 150,000 and a number-average molecular weight of greater than 60,000 and less than 100,000. These three factors can have synergistic effects, and make the prepared high-frequency circuit substrates have better high frequency dielectric properties. Its dielectric constant (10 GHz) can be as low as 3.6 or less, and the dielectric loss tangent (10 GHz) can reach 0.005 or less. It has better thermal oxidative aging performance, and an oxidation induction time of 20 min or more at the temperature of 170° C. and an oxidation induction time of 12 min or more at the temperature of 210° C., and an oxidation induction time of 2 min or more at the temperature of 230° C. Meanwhile, it also improves the process operability, and makes it easy to prepare prepregs. In order to achieve the aforesaid technical effects, three conditions are indispensable, and must be met at the same time.

The component A is a thermosetting resin based on polybutadiene or a copolymer resin of polybutadiene and styrene having a molecular weight of 11,000 or less, being composed of carbon and hydrogen elements and containing 60% or more of vinyl groups. The thermosetting resin has a molecular weight of 11,000 or less, e.g. 7000, 7200, 7500, 7800, 8000, 8200, 8500, 8800, 9000, 9200, 9500, 9800, 10000, 10500 or 11000, as well as the specific point values between the above values. Due to space limitation and for concise consideration, the present invention is not intended to exhaust the specific point values included in the range of the present invention. Preferably, the thermosetting mixture has a molecular weight of 8,000 or less.

The thermosetting resin based on polybutadiene or a copolymer resin of polybutadiene and styrene having a molecular weight of 11,000 or less, being composed of carbon and hydrogen elements and containing 60% or more of vinyl groups of the present invention is in a liquid state at room temperature, and the liquid resin has a very low viscosity, so as to be conducive to the subsequent impregnation process operation. Meanwhile, the crosslinking via a large amount of unsaturated double bonds in such resin provides the circuit substrates with required high-frequency dielectric properties and high temperature resistance.

The component B is an ethylene-propylene rubber having a weight-average molecular weight of greater than 100,000 and less than 150,000 and a number-average molecular weight of greater than 60,000 and less than 100,000 and being in a solid state at room temperature. The ethylene-propylene rubber has a weight-average molecular weight of greater than 100,000 and less than 150,000, e.g. 102,000, 105,000, 107,000, 109,000, 110,000, 112,000, 115,000, 118,000, 120,000, 122,000, 125,000, 128,000, 130,000, 132,000, 135,000, 138,000, 140,000, 142,000, 145,000, 148,000 or 149,000, and a number-average molecular weight of greater than 60,000 and less than 100,000, e.g. 62,000, 65,000, 67,000, 69,000, 70,000, 72,000, 75,000, 78,000, 80,000, 92,000, 95,000 or 98,000, as well as the specific point values between the above values. Due to space limitation and for concise consideration, the present invention is not intended to exhaust the specific point values included in the range of the present invention. Preferably, the ethylene-propylene rubber having a weight-average molecular weight of greater than 100,000 and less than 120,000 and a number-average molecular weight of greater than 60,000 and less than 80,000.

The ethylene-propylene rubber of the present invention preferably has a weight-average molecular weight of greater than 100,000 and less than 120,000 and a number-average molecular weight of greater than 60,000 and less than 80,000. Such preferred ethylene-propylene rubber can achieve the effect of better process performance, and provide the circuit substrate with required high-frequency dielectric properties and thermal oxidative aging resistance.

Said ethylene-propylene rubber of the present invention is selected from the group consisting of ethylene-propylene methylene rubber, ethylene-propylene diene methylene rubber, or a mixture thereof, e.g. ethylene-propylene methylene rubber or ethylene-propylene diene methylene rubber, or a mixture of ethylene-propylene methylene rubber and ethylene-propylene diene methylene rubber, preferably ethylene-propylene diene methylene rubber, and further preferably ethylene-propylene diene methylene rubber having an ethylene ratio of more than 65%.

The ethylene-propylene diene methylene rubber having an ethylene ratio of more than 65% of the present invention has better subsequent processability.

The commercially available ethylene-propylene rubber usually has a relatively great weight-average molecular weight and a relatively great number-average molecular weight, and is difficult to achieve the molecular weight distribution range required by the present invention. Therefore, it is difficult to obtain good process solubility. In order to obtain the molecular weight required by the present invention, the commercially available high molecular weight ethylene-propylene rubber is plasticated by a two-roll or three-roll mixer until the specified molecular weight is reached.

In order to achieve better process operability and better thermal oxidative aging resistance, the component A in the thermosetting mixture has a weight of 75%-95% of the total weight of the components A and B, e.g. 75%, 78%, 80%, 82%, 85%, 88%, 90%, 92%, 94% or 95% as well as the specific point values between the above values. Due to space limitation and for concise consideration, the present invention is not intended to exhaust the specific point values included in the range of the present invention. The component B in the thermosetting mixture has a weight of 5%-25% of the total weight of the components A and B, e.g. 5%, 8%, 10%, 12%, 15%, 18%, 20%, 22%, 23% or 25%, as well as the specific point values between the above values. Due to space limitation and for concise consideration, the present invention is not intended to exhaust the specific point values included in the range of the present invention.

2. Powder Filler

The powder filler of the present invention is in an amount of 0-70 parts by weight of the total weight of the components of the composite (based on the total weight pars of the composite), e.g. 0, 5, 10, 12, 18, 20, 25, 30, 35, 40, 45, 48, 50, 52, 55, 57, 60, 62, 65, 68 or 70 parts by weight, as well as the specific point values between the above values. Due to space limitation and for concise consideration, the present invention is not intended to exhaust the specific point values included in the range of the present invention.

The powder filler of the present invention is selected from the group consisting of crystalline silica, fused silica, spherical silica, titania, strontium titanate, barium titanate, boron nitride, aluminum nitride, silicon carbide, alumina, glass fiber, polytetrafluoroethylene, polyphenylene sulfide and polyethersulfone. The aforesaid fillers can be applied alone or in combination. The typical but non-limitative mixtures include crystalline silica and titania, fused silica and barium titanate, aluminum nitride and alumina, glass fiber and polyphenylene sulfide, strontium titanate and polyethersulfone.

The optimum filler is silica, including anyone selected from the group consisting of crystalline silica, fused silica, spherical silica, or a mixture of at least two selected therefrom.

The powder filler of the present invention has a median diameter of 1 µm-15 µm, e.g. 1 µm, 3 µm, 5 µm, 8 µm, 10 µm, 11 µm, 12 µm, 13 µm, 14 µm or 15 µm, as well as the specific point values between the above values. Due to space limitation and for concise consideration, the present invention is not intended to exhaust the specific point values included in the range of the present invention. Preferably, the powder filler has a median diameter of 1 µm-10 µm, and the filler within such particle size range has better dispersibility. The available silica fillers include CE44I (CE minerals), FB-35 (Denka), 525 (Sibelco) and the like.

3. Glass Fiber Cloth

In the composite of the present invention, the glass fiber cloth has a weight of 10 to 60 parts by weight based on the total weight of the components of the composite (based on the total parts by weight of the composite), e.g. 10, 12, 15, 18, 20, 22, 25, 30, 35, 40, 45, 48, 50, 52, 55, 57 or 60 parts by weight, as well as the specific point values between the above values. Due to space limitation and for concise consideration, the present invention is not intended to exhaust the specific point values included in the range of the present invention. Preferably, it has a weight of 30 to 57 parts by weight based on the total weight of the components of the composite.

According to different substrate requirements, different glass fiber cloths are used, e.g. E-glass glass fiber cloth, NE-glass glass fiber cloth, Q-glass glass fiber cloth; the models thereof include 7628, 2116, 1080, 106 and 104. The specifications and models of the commercially available glass cloths can be used for the production of the composite of the present invention, and the glass cloths are not limited to the above-mentioned glass cloth types. In addition to the glass fiber cloth, other types of woven fabrics may also be used, such as PTFE fiber cloth, aramid fiber woven fabric, and the like.

4. Curing Initiator

In the composite of the present invention, the curing initiator has a weight of 1 to 3 parts by weight based on the total weight of the components of the composite (based on the total parts by weight of the composite), e.g. 1, 1.5, 2, 2.5 or 3 parts by weight, as well as the specific point values between the above values. Due to space limitation and for concise consideration, the present invention is not intended to exhaust the specific point values included in the range of the present invention.

The curing initiator of the present invention is the materials which can produce free radicals. The preferred curing initiator is anyone selected from the group consisting of dicumyl peroxide, t-butyl peroxy benzoate and 2,5-bis-(2-ethylhexanoyl peroxide)-2,5-dimethylhexane, or a mixture of at least two selected therefrom, wherein the typical but non-limiting mixtures are a mixture of dicumyl peroxide and t-butyl peroxy benzoate, and a mixture of t-butyl peroxy benzoate and 2,5-bis-(2-ethylhexanoyl peroxide)-2,5-dimethylhexane.

5. Flame Retardant

The composite of the present invention may further contain a flame retardant in an amount of from 0% to 35% by weight of the total weight of the components of the composite (based on the total weight of the composite), e.g. 0, 2, 5, 10, 12, 15, 18, 20, 25, 28, 30, 32 or 35%, as well as the specific point values between the above values. Due to space limitation and for concise consideration, the present invention is not intended to exhaust the specific point values included in the range of the present invention.

The present invention discloses using a bromine-containing or a phosphorus-containing flame retardant, wherein the flame retardants used are preferred not to reduce the dielectric properties. The optimum bromine-containing flame retardant is anyone selected from the group consisting of decabromodiphenyl ether, decabromodiphenyl ethane and ethylene bistetrabromophthalimide, or a mixture of at least two selected therefrom. The optimum phosphorus-containing flame retardant is anyone selected from the group consisting of tri-(2,6-dimethylphenyl)phosphine, 10-(2,5-dihydroxyphenyl)-9,10-dihydro-9-oxa-10-phosphaphenanthrene-10-oxide, 2,6-bis-(2,6-dimethylphenyl)-phosphinobenzene and 10-phenyl-9,10-dihydro-9-oxa-10-phosphaphenanthrene-10-oxide, or a mixture of at least two selected therefrom.

6. Auxiliary Crosslinking Agent

In the composite of the present invention, a certain amount of auxiliary crosslinking agent may be added to increase the crosslinking density, and the auxiliary crosslinking agent includes a monomer or a low molecular weight copolymer having unsaturated double bonds or unsaturated triple bonds in the molecular structure. There may be enumerated anyone selected from the group consisting of triallyl trimeric isocyanate, triallyl cyanurate, divinylbenzene and polyfunctional acrylate, or a mixture of at least two selected therefrom.

7. Other Components

According to the present invention, other resin materials with unsaturated double bonds or unsaturated triple bonds may be added into the composite, and used together with the components A and B. Such wording "other" means in addition to polybutadiene or a copolymer resin of polybutadiene and styrene having a molecular weight of 11,000 or less, being composed of carbon and hydrogen elements and containing 60% or more of vinyl groups. Examples of the resin materials include cyanate resin, polyphenylene ether resin, vinyl or acrylic group-terminated polyphenylene ether resin, allyl-containing polyphenylene ether resin, bismaleimide resin and vinyl-terminated silicone resin, or a mixture of at least two selected therefrom, and is not limited to the resin materials listed above.

II. Preparation of Laminates from the Composite

The laminates of the present invention comprise a plurality of layers of superimposed prepregs, each of which is made of the composite.

III. Preparation of High-Frequency Circuit Substrate from the Composite

The high-frequency circuit substrate of the present invention comprises a plurality of layers of superimposed prepregs and copper foils pressed on both sides thereof, wherein each of the prepregs is made of the composite.

The process for preparing the high-frequency circuit substrate from the aforesaid composite comprises the following steps, Step I weighing the following components of the composite,
(1) from 20 to 70 parts by weight of a thermosetting mixture, comprising:
(A) a thermosetting resin based on polybutadiene or a copolymer resin of polybutadiene and styrene having a molecular weight of 11,000 or less, being composed of carbon and hydrogen elements and containing 60% or more of vinyl groups; and
(B) an ethylene-propylene rubber having a weight-average molecular weight of greater than 100,000 and less than 150,000 and a number-average molecular weight of greater than 60,000 and less than 100,000 and being in a solid state at room temperature;
(2) from 10 to 60 parts by weight of a glass fiber cloth;
(3) from 0 to 70 parts by weight of a powder filler; and
(4) from 1 to 3 parts by weight of a curing initiator;

Step II mixing the weighed thermosetting mixture, powder filler and curing initiator, diluting with a solvent to a suitable viscosity, homogeneously stirring and mixing to make the powder filler dispersed in the thermosetting resin homogeneously to obtain a glue solution, impregnating the glass fiber cloth with the glue solution, controlling to a suitable thickness, and then removing the solvent to form a prepreg;

Step III laminating a plurality of said prepregs, pressing a copper foil on the upper and bottom side thereof respectively, curing in a press at a curing temperature of 150° C.-300° C. and a curing pressure of 25 kg/cm$^2$-70 kg/cm$^2$, to obtain the high-frequency circuit substrate.

In accordance to the dielectric properties, i.e. dielectric constant and dielectric loss angle tangent, high frequency properties and thermal oxidative aging resistance of the high-frequency circuit substrate above, the following examples are provides for detailed description.

Oxidation induction time: increasing the temperature at a constant rate in nitrogen, switching to oxygen in the same flow rate (50 mL/min) when reach the required temperature, keeping the sample at this constant temperature until oxidation reaction was shown on the DSC thermal analysis curve.

The components of the composites selected in the examples or comparison examples of the present invention are shown in Table 1 below.

TABLE 1

| Manufacturers | Product names/Models | Materials |
|---|---|---|
| Sartomer | Ricon 100 | Copolymer resin of styrene and butadiene, Mn = 4,500, 1,2-ethylene = 70% |
| SABIC | SA-9000 | Terminal methacrylate modified polyphenylene ether resin |
| Lion Copolymer | Royalene 301T | EPDM rubber, Mw = 560,000 (weight-average molecular weight), Mn = 300,000 |
| Lion Copolymer | Royalene trilene 67 | EPDM rubber, Mw = 42,000, Mn = 7000 |
| Huifeng, Shanghai | HF-10 | Bisphenol A-type cyanate |
| Sibelco | 525 | Silica powder |
| Kemaki, Australia | CR828 | Titanium dioxide |
| Albemarle | SAYTEX8010 | decabromodiphenyl ethane |
| Otsuka chemical | SPB-100 | Phosphorus-containing flame retardant |
| Gaoqiao, Shanghai | DCP | Dicumyl peroxide |
| Honghe, Shanghai | 1080 glass fiber cloth | Thickness of 0.05 mm and basis weight of 48 g/m$^2$ |
| Lion Copolymer | Copo 1502C | Butadiene styrene rubber |
| Sinopec | BR9000 | Cis-butadiene rubber |

Ethylene-propylene methylene rubber EPM1: plasticating an ethylene-propylene methylene rubber (foreign experimental product, no model) in a three-roll plasticator to the weight-average molecular weight of 110,000 and the number-average molecular weight of 80,000, marked as ethylene-propylene methylene rubber EPM1 having a vinyl ratio of 68%.

Ethylene-propylene methylene rubber EPM2: plasticating an ethylene-propylene methylene rubber (foreign experimental product, no model) in a three-roll plasticator to the weight-average molecular weight of 140,000 and the number-average molecular weight of 90,000, marked as ethylene-propylene methylene rubber EPM2 having a vinyl ratio of 72%.

Ethylene-propylene methylene rubber EPM3: plasticating an ethylene-propylene methylene rubber (foreign experimental product, no model) in a three-roll plasticator to the weight-average molecular weight of 110,000 and the number-average molecular weight of 80,000, marked as ethylene-propylene methylene rubber EPM3 having a vinyl ratio of 50%.

Ethylene-propylene methylene rubber EPM4: plasticating an ethylene-propylene methylene rubber (foreign experimental product, no model) in a three-roll plasticator to the weight-average molecular weight of 90,000 and the number-average molecular weight of 50,000, marked as ethylene-propylene methylene rubber EPM4 having a vinyl ratio of 68%.

Ethylene-propylene methylene rubber EPM5: plasticating an ethylene-propylene methylene rubber (foreign experimental product, no model) in a three-roll plasticator to the weight-average molecular weight of 180,000 and the number-average molecular weight of 120,000, marked as ethylene-propylene methylene rubber EPM5 having a vinyl ratio of 68%.

Ethylene-propylene diene methylene rubber EPDM1: plasticating an ethylene-propylene methylene diene rubber Royalene 301T in a three-roll plasticator to the weight-average molecular weight of 110,000 and the number-average molecular weight of 75,000, marked as ethylene-propylene diene methylene rubber EPDM1 having a vinyl ratio of 65%.

Ethylene-propylene diene methylene rubber EPDM2: plasticating an ethylene-propylene methylene diene rubber (foreign experimental product, no model) in a three-roll plasticator to the weight-average molecular weight of 145,000 and the number-average molecular weight of 95,000, marked as ethylene-propylene diene methylene rubber EPDM2 having a vinyl ratio of 65%.

Ethylene-propylene diene methylene rubber EPDM3: plasticating an ethylene-propylene methylene diene rubber (foreign experimental product, no model) in a three-roll plasticator to the weight-average molecular weight of 110,000 and the number-average molecular weight of 75,000, marked as ethylene-propylene diene methylene rubber EPDM3 having a vinyl ratio of 63%.

Ethylene-propylene diene methylene rubber EPDM4: plasticating an ethylene-propylene methylene diene rubber (foreign experimental product, no model) in a three-roll plasticator to the weight-average molecular weight of 80,000 and the number-average molecular weight of 55,000, marked as ethylene-propylene diene methylene rubber EPDM4 having a vinyl ratio of 65%.

Ethylene-propylene diene methylene rubber EPDM5: plasticating an ethylene-propylene methylene diene rubber (foreign experimental product, no model) in a three-roll plasticator to the weight-average molecular weight of 160,000 and the number-average molecular weight of 130,000, marked as ethylene-propylene diene methylene rubber EPDM5 having a vinyl ratio of 65%.

Ethylene-propylene diene methylene rubber EPDM6: plasticating an ethylene-propylene methylene diene rubber (foreign experimental product, no model) in a three-roll plasticator to the weight-average molecular weight of 110,000 and the number-average molecular weight of 40,000, marked as ethylene-propylene diene methylene rubber EPDM6 having a vinyl ratio of 70%.

EXAMPLES

A process for preparing the high-frequency circuit substrates comprises the following steps, Mixing the components involved in the examples in accordance with the adding amounts shown in the following table, adjusting to a suitable viscosity with the solvent toluene, homogeneously stirring and mixing to obtain a glue solution;

Impregnating 1080 glass fiber cloth with the glue solution above, oven-drying to remove the solvent to obtain a prepreg, overlapping 8 sheets of the prepared prepregs, pressing copper foils having a thickness of 1 oz on their both sides, curing in a press for 2 hours, wherein the curing pressures was 50 kg/cm$^2$, and the curing temperature was 190° C.

Comparison Examples

The components involved in the comparison Examples were mixed according to the adding amounts in the table below, and the high-frequency circuit substrates were prepared according to the process above.

The performance tests were carried out to high-frequency circuit substrates prepared in the examples and comparison examples, and the specific results were shown in the table below.

TABLE 2

|  | Example 1 | Example 2 | Example 3 | Example 4 | Example 5 | Example 6 |
|---|---|---|---|---|---|---|
| EPM1 (having a weight-average molecular weight of 110,000, and a number-average molecular weight of 80,000, 68%) | 10 |  |  |  |  |  |
| EPM2 (having a weight-average molecular weight of 140,000, and a number-average molecular weight of 90,000, 72%) |  | 10 |  |  |  |  |
| EPM3 (having a weight-average molecular weight of 110,000, and a number-average molecular weight of 80,000, 50%) |  |  | 10 |  |  |  |
| EPDM1 (having a weight-average molecular weight of 110,000, and a number-average molecular weight of 75,000, 65%) |  |  |  | 10 |  |  |
| EPDM2 (having a weight-average molecular weight of 145,000, and a number-average molecular weight of 95,000, 65%) |  |  |  |  | 10 |  |
| EPDM3 (having a weight-average molecular weight of 110,000, and a number-average molecular weight of 75,000, 63%) |  |  |  |  |  | 10 |
| Copolymer resin of polybutadiene and styrene Ricon 100 | 60 | 60 | 60 | 60 | 60 | 60 |
| Silicon powder 525 | 50 | 50 | 50 | 50 | 50 | 50 |
| Phosphorus-containing flame retardant SPB-100 | 32 | 32 | 32 | 32 | 32 | 32 |
| Dicumyl peroxide DCP | 2.5 | 2.5 | 2.5 | 2.5 | 2.5 | 2.5 |
| Dielectric constant (10 GHz) | 3.45 | 3.44 | 3.45 | 3.46 | 3.44 | 3.43 |
| Dielectric loss angle tangent (10 GHz) | 0.004 | 0.004 | 0.005 | 0.004 | 0.004 | 0.004 |
| Dip soldering resistance, 288° C.(s) | >120 | >120 | >120 | >120 | >120 | >120 |
| Oxidation induction time (170° C.), min | 17 | 18 | 10 | 20 | 23 | 22 |
| Oxidation induction time (190° C.), min | 10 | 11 | 8 | 12 | 16 | 15 |
| Oxidation induction time (210° C.), min | 6 | 8 | 6 | 8 | 11 | 10 |
| Oxidation induction time (230° C.), min | 1.5 | 1.7 | 0.9 | 2 | 2.6 | 2.5 |
| Solubility of rubber in toluene | Good | Average | Good | Good | Average | Good |
| Impregnation process operability of fiberglass cloth | Good | Average | Average | Good | Good | Average |

The following can be found from Table 2.

(1) The high-frequency circuit substrates prepared according to Examples 1-6 had better high frequency dielectric properties, a dielectric constant (10 GHz) which was as low as 3.46 or less, dielectric loss angle tangent (10 GHz) which was as low as 0.005 or less, better thermal oxidative aging performance, dip soldering resistance which was more than 120 seconds at 288° C., an oxidation induction time which was 10 min or more at 170° C., an oxidation induction time which was 8 min or more at 210° C. and an oxidation induction time which was 0.9 min or more at 230° C.

(2) By comparing Examples 4 and 5, it could be found that EPDM having a weight-average molecular weight of more than 100,000 and less than 120,000 and having a number-average molecular weight of more than 60,000 and less than 80,000 in Example 4 has a good solubility in toluene. EPDM having a weight-average molecular weight of more than 120,000 and less than 150,000 and having a number-average molecular weight of more than 80,000 and less than 100,000 in Example 5 had a common solubility in toluene, so as to indicate that EPDM having a weight-average molecular weight of more than 100,000 and less than 120,000 and having a number-average molecular weight of more than 60,000 and less than 80,000 can provide the composite with better solvent solubility.

(3) By comparing Examples 1 and 3, it could be found that high-frequency circuit substrates prepared from EPM having a vinyl ratio of 68% in Example 1 had lower dielectric loss angle tangent and more excellent thermal oxidative aging resistance than those prepared from EPM having a vinyl ratio of 50% in Example 3, could make the operability of glass fiber cloth impregnation process better, so as to indicate that the use of EPM having a vinyl ratio of greater than 65% had better high-frequency dielectric properties and more excellent thermal oxidative aging resistance, and made the operability of the glass fiber cloth impregnation process better.

(4) By comparing Examples 4 and 6, it could be found that EPDM having a vinyl ratio of 65% in Example 4 could make the operability of the glass fiber cloth impregnation process better; the operability of the glass fiber cloth impregnation process by using EPDM having a vinyl ratio of 63% in Example 6 was common, so as to indicate that EPDM having a vinyl ratio of 65% can make the operability of the glass fiber cloth impregnation process better than EPDM having a vinyl ratio of 65% or less.

(5) By comparing Examples 4-6 and 1-3, it could be found that Examples 4-6 using EPDM had more excellent thermal oxidative aging resistance than Examples 1-3 using EPM. For example, high-frequency circuit substrates prepared in Examples 4-6 had an oxidation induction time which was 20 min or more at 170° C. and an oxidation induction time which was 2 min or more at 230° C., while high-frequency circuit substrates prepared in Examples 1-3 had an oxidation induction time which was as high as only 18 min at 170° C. and an oxidation induction time which was as high as 1.7 min at 230° C., which indicated a worse thermal oxidative aging performance than those in Examples 4-6.

TABLE 3

|  | Com. Ex. 1 | Com. Ex. 2 | Com. Ex. 3 | Com. Ex. 4 | Com. Ex. 5 | Com. Ex. 6 | Com. Ex. 7 |
| --- | --- | --- | --- | --- | --- | --- | --- |
| EPM4 (having a weight-average molecular weight of 90,000, and a number-average molecular weight of 50,000, 68%) | 10 | | | | | | |
| EPM5 (having a weight-average molecular weight of 180,000, and a number-average molecular weight of 120,000, 68%) | | 10 | | | | | |
| EPDM4 (having a weight-average molecular weight of 80,000, and a number-average molecular weight of 55,000, 65%) | | | 10 | | | | |
| EPDM5 (having a weight-average molecular weight of 160,000, and a number-average molecular weight of 130,000, 65%) | | | | 10 | | | |
| EPDM6 (having a weight-average molecular weight of 110,000, and a number-average molecular weight of 40,000, 65%) | | | | | 10 | | |
| Royalene 301T(Mw≥50 = 560,000 (weight-average molecular weight), Mn = 300,000) | | | | | | 10 | |
| Royalene trilene 67(Mw = 42,000, Mn = 7000) | | | | | | | 10 |
| Copolymer resin of polybutadiene and styrene Ricon 100 | 60 | 60 | 60 | 60 | 60 | 60 | 60 |
| Silicon powder 525 | 50 | 50 | 50 | 50 | 50 | 50 | 50 |
| Phosphorus-containing flame retardant SPB-100 | 32 | 32 | 32 | 32 | 32 | 32 | 32 |
| Dicumyl peroxide DCP | 2.5 | 2.5 | 2.5 | 2.5 | 2.5 | 2.5 | 2.5 |
| Dielectric constant (10 GHz) | 3.47 | 3.47 | 3.47 | 3.49 | 3.46 | 3.48 | 3.46 |

TABLE 3-continued

|  | Com. Ex. 1 | Com. Ex. 2 | Com. Ex. 3 | Com. Ex. 4 | Com. Ex. 5 | Com. Ex. 6 | Com. Ex. 7 |
|---|---|---|---|---|---|---|---|
| Dielectric loss angle tangent (10 GHz) | 0.004 | 0.005 | 0.004 | 0.005 | 0.004 | 0.005 | 0.004 |
| Dip soldering resistance, 288° C.(s) | >120 | 60 | >120 | 50 | >120 | 30 | >120 |
| Oxidation induction time (170° C.), min | 12 | 22 | 15 | 23 | 12 | 30 | 9 |
| Oxidation induction time (190° C.), min | 8 | 13 | 10 | 14 | 7 | 24 | 5 |
| Oxidation induction time (210° C.), min | 4 | 9 | 5 | 10 | 4 | 18 | 2.2 |
| Oxidation induction time (230° C.), min | 1.1 | 3 | 1.3 | 3 | 1.2 | 6 | 0.6 |
| Solubility of rubber in toluene | Good | Insoluble | Good | Insoluble | Good | Insoluble | Good |
| Impregnation process operability of fiberglass cloth | Good | Worse | Good | Worse | Good | Worse | Good |

The following can be found by comparing the results in Tables 2 and 3.

(1) By comparing Example 1 to Comparison Example 1, it could be found that high-frequency circuit substrates prepared from EPM having a weight-average molecular weight of more than 100,000 and less than 150,000 and having a number-average molecular weight of more than 60,000 and less than 100,000 in Example 1 had a dielectric constant of only 3.45, and an oxidation induction time of 17 min, 10 min, 6 min and 1.5 min respectively at 170° C., 190° C., 210° C. and 230° C., while high-frequency circuit substrates prepared from EPM having a weight-average molecular weight of less than 100,000 and having a number-average molecular weight of less than 60,000 in Comparison Example 1 had a dielectric constant of 3.47, and an oxidation induction time of 12 min, 8 min, 4 min and 1.1 min respectively at 170° C., 190° C., 210° C. and 230° C. Therefore, it could be seen that high-frequency circuit substrates prepared from EPM having a weight-average molecular weight of more than 100,000 and less than 150,000 and having a number-average molecular weight of more than 60,000 and less than 100,000 in Example 1 had better high frequency dielectric properties and more excellent thermal oxidative aging performance than those prepared from EPM having a weight-average molecular weight of less than 100,000 and having a number-average molecular weight of less than 60,000 in Comparison Example 1.

Likewise, it could be seen by comparing Example 4 to Comparison Example 3 that high-frequency circuit substrates prepared from EPDM having a weight-average molecular weight of more than 100,000 and less than 150,000 and having a number-average molecular weight of more than 60,000 and less than 100,000 in Example 4 had better high frequency dielectric properties and more excellent thermal oxidative aging performance than those prepared from EPDM having a weight-average molecular weight of less than 100,000 and having a number-average molecular weight of less than 60,000 in Comparison Example 3.

(2) By comparing Example 1 to Comparison Example 2, it could be found that high-frequency circuit substrates prepared from EPM having a weight-average molecular weight of more than 100,000 and less than 150,000 and having a number-average molecular weight of more than 60,000 and less than 100,000 in Example 1 had a dielectric constant of only 3.45, and a dip soldering resistance of more than 120 seconds at 288° C. Moreover, the rubber had better solubility in toluene, better operability of glass fiber cloth impregnation. However, high-frequency circuit substrates prepared from EPM having a weight-average molecular weight of more than 150,000 and having a number-average molecular weight of more than 120,000 in Comparison Example 2 had a dielectric constant of only 3.47, and a dip soldering resistance of only 60 seconds at 288° C. Moreover, the rubber was insoluble in toluene, and had a worse operability of glass fiber cloth impregnation.

Therefore, it could be seen that high-frequency circuit substrates prepared from EPM having a weight-average molecular weight of more than 100,000 and less than 150,000 and having a number-average molecular weight of more than 60,000 and less than 100,000 in Example 1 had better high frequency dielectric properties and more excellent dip soldering resistance, as well as better solvent solubility and more excellent operability of glass fiber cloth impregnation than those prepared from EPM having a weight-average molecular weight of more than 150,000 and having a number-average molecular weight of more than 120,000 in Comparison Example 2.

By comparing Example 4 to Comparison Example 4, it could be found that high-frequency circuit substrates prepared from EPDM having a weight-average molecular weight of more than 100,000 and less than 150,000 and having a number-average molecular weight of more than 60,000 and less than 100,000 in Example 4 had better high frequency dielectric properties and more excellent dip soldering resistance, as well as better solvent solubility and more excellent operability of glass fiber cloth impregnation than those prepared from EPDM having a weight-average molecular weight of more than 150,000 and having a number-average molecular weight of more than 120,000 in Comparison Example 4.

(3) By comparing Example 4 to Comparison Example 5, it could be found that high-frequency circuit substrates prepared from EPDM having a weight-average molecular weight of more than 100,000 and less than 150,000 and having a number-average molecular weight of more than 60,000 and less than 100,000 in Example 4 had an oxidation induction time of 20 min, 12 min, 8 min and 2 min respectively at 170° C., 190° C., 210° C. and 230° C., while high-frequency circuit substrates prepared from EPDM having a weight-average molecular weight of more than 100,000 and less than 150,000 and having a number-average molecular weight of less than 60,000 in Comparison Example 5 had an oxidation induction time of 12 min, 7 min, 4 min and 1.2 min respectively at 170° C., 190° C., 210° C. and 230° C. This indicates that high-frequency circuit substrates prepared from EPDM having a weight-average molecular weight of more than 100,000 and less than 150,000 and having a number-average molecular weight of more than 60,000 and less than 100,000 in Example 4 had more excellent thermal oxidative aging performance than those prepared from EPDM having a weight-average molecular weight of more than 100,000 and less than 150,000 and having a number-average molecular weight of less than 60,000 in Comparison Example 5.

(4) By comparing Example 4 to Comparison Example 6, it could be found that high-frequency circuit substrates prepared from EPDM having a weight-average molecular weight of more than 100,000 and less than 150,000 and having a number-average molecular weight of more than 60,000 and less than 100,000 in Example 4 had more excellent high frequency dielectric properties, better solvent solubility and more excellent operability of glass fiber cloth impregnation than those prepared from EPDM having a weight-average molecular weight of 300,000 in Comparison Example 6.

(5) By comparing Example 4 to Comparison Example 7, it could be found that high-frequency circuit substrates prepared from EPDM having a weight-average molecular weight of more than 100,000 and less than 150,000 and having a number-average molecular weight of more than 60,000 and less than 100,000 in Example 4 had more excellent thermal oxidative aging performance than those prepared from EPDM having a weight-average molecular weight of only 7,000 in Comparison Example 7.

TABLE 4

| | Com. Ex. 8 | Com. Ex. 9 | Com. Ex. 10 | Com. Ex. 11 | Com. Ex. 12 |
|---|---|---|---|---|---|
| EPM1 (having a weight-average molecular weight of 110,000, and a number-average molecular weight of 80,000, 68%) | | 10 | | | |
| EPDM having a weight-average molecular weight of greater than 100,000 and less than 150,000, and a number-average molecular weight of greater than 60,000 and less than 100,000 and being in a liquid state at room temperature | 10 | | | | |
| EPM having a weight-average molecular weight of greater than 100,000 and less than 150,000, and a number-average molecular weight of greater than 60,000 and less than 10,000 and being in a liquid state at room temperature | | | 10 | | |
| Butadiene styrene rubber | | | | 10 | |
| Cis-butadiene rubber | | | | | 10 |
| Copolymer resin of polybutadiene and styrene Ricon 100 | 60 | | 60 | 60 | 60 |
| Polybutadiene RB810 having a molecular weight of more than 11,000 | | 60 | | | |
| Silicon powder 525 | 50 | 50 | 50 | 50 | 50 |
| Phosphorus-containing flame retardant SPB-100 | 32 | 32 | 32 | 32 | 32 |
| Dicumyl peroxide DCP | 2.5 | 2.5 | 2.5 | 2.5 | 2.5 |
| Dielectric constant (10 GHz) | 3.48 | 3.48 | 3.46 | 3.52 | 3.51 |
| Dielectric loss angle tangent (10 GHz) | 0.004 | 0.005 | 0.004 | 0.005 | 0.005 |
| Dip soldering resistance, 288° C.(s) | >120 | 60 | >120 | >120 | >120 |
| Oxidation induction time (170° C.), min | 18 | 25 | 15 | 11 | 10 |
| Oxidation induction time (190° C.), min | 11 | 19 | 8 | 9 | 8 |
| Oxidation induction time (210° C.), min | 7 | 16 | 5 | 5 | 4 |

TABLE 4-continued

|  | Com. Ex. 8 | Com. Ex. 9 | Com. Ex. 10 | Com. Ex. 11 | Com. Ex. 12 |
|---|---|---|---|---|---|
| Oxidation induction time (230° C.), min | 1.9 | 5 | 1.2 | 1.3 | 0.8 |
| Solubility of rubber in toluene | Good | Good | Good | Average | Average |
| Impregnation process operability of fiberglass cloth | Good | Worse | Good | Average | Average |

The following can be found by comparing the results in Tables 2 and 4.

(1) By comparing Example 4 to Comparison Example 8, it could be found that high-frequency circuit substrates prepared from EPDM having a weight-average molecular weight of more than 100,000 and less than 150,000 and having a number-average molecular weight of more than 60,000 and less than 100,000 and being in a solid state at room temperature in Example 4 had more excellent high frequency dielectric properties and thermal oxidative aging performance than those prepared from EPDM having a weight-average molecular weight of more than 100,000 and less than 150,000 and having a number-average molecular weight of more than 60,000 and less than 100,000 and being in a liquid state at room temperature in Comparison Example 8.

By comparing Example 1 to Comparison Example 10, it could be found that high-frequency circuit substrates prepared from EPM having a weight-average molecular weight of more than 100,000 and less than 150,000 and having a number-average molecular weight of more than 60,000 and less than 100,000 and being in a solid state at room temperature in Example 1 had more excellent high frequency dielectric properties and thermal oxidative aging performance than those prepared from EPM having a weight-average molecular weight of more than 100,000 and less than 150,000 and having a number-average molecular weight of more than 60,000 and less than 100,000 and being in a liquid state at room temperature in Comparison Example 10.

Thus it can be seen that high-frequency circuit substrates prepared from EPM or EPDM having a weight-average molecular weight of more than 100,000 and less than 150,000 and having a number-average molecular weight of more than 60,000 and less than 100,000 and being in a solid state at room temperature in the present invention had more excellent high frequency dielectric properties and thermal oxidative aging performance than those prepared from EPM or EPDM having the same weight-average molecular weight and same number-average molecular weight and being in a liquid state at room temperature.

(2) By comparing Examples 1 and 4 to Comparison Examples 11-12, it could be found that high-frequency circuit substrates prepared from EPR in Examples 1 and 4 had more excellent high frequency dielectric properties and thermal oxidative aging performance, as well as better solvent solubility and operability of glass fiber cloth impregnation than those prepared from styrene-butadiene rubber in Comparison Example 11 and butadiene rubber in Comparison Example 12.

(3) By comparing Example 1 to Comparison Example 9, it could be found that high-frequency circuit substrates prepared from the thermosetting resin based on polybutadiene or a copolymer resin of polybutadiene and styrene having a molecular weight of 11,000 or less, being composed of carbon and hydrogen elements and containing 60% or more of vinyl groups in Example 1 had more excellent high frequency dielectric properties, dip soldering resistance, as well as more excellent operability of glass fiber cloth impregnation than those prepared from polybutadiene RB810 having a molecular weight of 11,000 or more in Comparison Example 9.

By comparing the results in Tables 2, 3 and 4, it can be concluded that the ethylene-propylene rubber in the present invention needs to satisfy the following three conditions simultaneously: (1) using an ethylene-propylene rubber; (2) using an ethylene-propylene rubber which is in a solid state at room temperature; and (3) using an ethylene-propylene rubber having a weight-average molecular weight of more than 100,000 and less than 150,000 and having a number-average molecular weight of greater than 60,000 and less than 100,000. These three factors which can play a synergistic effect not only make the prepared high-frequency circuit substrates have better high-frequency dielectric properties and better thermal oxidative aging performance, but also enhance the process operability, so as to make it easy to prepare prepregs.

TABLE 5

|  | Example 7 | Example 8 | Example 9 | Example 10 | Example 11 |
|---|---|---|---|---|---|
| EPDM1 (having a weight-average molecular weight of 110,000, and a number-average molecular weight of 75,000, 65%) | 17 | 5 | 25 | 5 | 5 |
| Copolymer resin of polybutadiene and styrene Ricon 100 | 53 | 65 | 45 |  |  |
| Polybutadiene Ricon 130 |  |  |  | 35 | 25 |
| Acrylic group-terminated polyphenylene ether resin SA-9000 |  |  |  | 30 |  |
| Bisphenol A type cyanate HF-10 |  |  |  |  | 5 |
| Silicon powder 525 | 50 | 50 | 50 |  |  |
| Titanium dioxide CR828 |  |  |  | 10 | 35 |

TABLE 5-continued

|  | Example 7 | Example 8 | Example 9 | Example 10 | Example 11 |
|---|---|---|---|---|---|
| Decabromodiphenyl ethane SAYTEX8010 |  |  |  |  | 7 |
| Phosphorus-containing flame retardant SPB-100 | 32 | 32 | 32 |  |  |
| Dicumyl peroxide DCP | 2.5 | 2.5 | 2.5 | 3 | 1.2 |
| Dielectric constant (10 GHz) | 3.47 | 3.46 | 3.45 | 4.12 | 4.75 |
| Dielectric loss angle tangent (10 GHz) | 0.004 | 0.004 | 0.005 | 0.006 | 0.006 |
| Dip soldering resistance, 288° C.(s) | >120 | >120 | 40 | >120 | >120 |
| Oxidation induction time (170° C.), mm | 23 | 16 | 24 | 18 | 17 |
| Oxidation induction time (190° C.), mm | 16 | 10 | 17 | 12 | 13 |
| Oxidation induction time (210° C.), mm | 14 | 7 | 12 | 9 | 8 |
| Oxidation induction time (230° C.), mm | 5 | 1.2 | 4 | 1.1 | 1.5 |
| Solubility of rubber in toluene | Good | Good | Good | Good | Good |
| Impregnation process operability of fiberglass cloth | Good | Good | Good | Good | Good |

TABLE 6

|  | Example 12 | Example 13 | Example 14 | Example 15 | Example 16 |
|---|---|---|---|---|---|
| EPM1 (having a weight-average molecular weight of 110,000, and a number-average molecular weight of 80,000, 68%) | 10 | 10 | 5 |  |  |
| EPM2 (having a weight-average molecular weight of 140,000, and a number-average molecular weight of 90,000, 72%) |  |  | 5 | 5 |  |
| EPDM1 (having a weight-average molecular weight of 110,000, and a number-average molecular weight of 75,000, 65%) |  |  |  | 5 | 5 |
| EPDM2 (having a weight-average molecular weight of 145,000, and a number-average molecular weight of 95,000, 65%) |  |  |  |  | 5 |
| Copolymer resin of polybutadiene and styrene Ricon 100 |  | 60 | 60 | 60 | 60 |
| Polybutadiene Ricon 130 | 55 |  |  |  |  |
| Silicon powder 525 |  | 50 | 50 | 50 | 50 |
| Titanium dioxide CR828 | 65 |  |  |  |  |
| Decabromodiphenyl ethane SAYTEX8010 | 32 |  |  |  |  |
| Phosphorus-containing flame retardant SPB-100 |  |  | 32 | 32 | 32 |
| Dicumyl peroxide DCP | 0.5 | 2.5 | 2.5 | 2.5 | 2.5 |
| Triallyl trimeric isocyanate TAIC | 5 |  |  |  |  |
| Dielectric constant (10 GHz) | 5.65 | 3.45 | 3.44 | 3.46 | 3.48 |
| Dielectric loss angle tangent (10 GHz) | 0.006 | 0.004 | 0.004 | 0.004 | 0.004 |
| Dip soldering resistance, 288° C.(s) | >120 | >120 | >120 | >120 | >120 |
| Oxidation induction time (170° C.), min | 18 | 17 | 15 | 18 | 20 |
| Oxidation induction time (190° C.), min | 11 | 10 | 10 | 11 | 15 |
| Oxidation induction time (210° C.), min | 9 | 6 | 5 | 7 | 8 |
| Oxidation induction time (230° C.), min | 1.9 | 1.5 | 1.2 | 1.8 | 2.3 |
| Solubility of rubber in toluene | Good | Good | Good | Good | Good |
| Impregnation process operability of fiberglass cloth | Good | Good | Good | Good | Good |

According to the results in Tables 5-6, it can be seen that, by adjusting the component ratios and types in the composites, increasing other resin components or auxiliary cross-linking agent component, the prepared high-frequency circuit substrates will have better thermal oxidative aging resistance and better high-frequency dielectric properties, as well as more excellent solubility and better process operability, so as to make it easy to prepare prepregs.

In conclusion, it can be seen that high-frequency circuit substrates prepared from the composites comprising an ethylene-propylene rubber having a weight-average molecular weight of more than 100,000 and less than 150,000 and having a number-average molecular weight of more than 60,000 and less than 100,000 and being in a solid state at room temperature not only have better high frequency dielectric properties, but also better thermal oxidative aging performance. Meanwhile, the materials have a good solvent solubility and better process operability, so as to make it easy to prepare prepregs, and can be widely used in the production of high-frequency circuit substrates.

The applicant has stated that the present invention illustrates the detailed process equipment and process flow of the present invention by the aforesaid examples. However, the present invention is not limited to the above-described detailed process equipment and process flow, i.e. it does not mean that the present invention cannot be achieved unless the detailed process equipment and process flow above are implemented. Those skilled in the art shall know that any improvements to the present invention, equivalent replacements of the raw materials of the present invention, addition of auxiliary ingredients and selection of specific manners all fall within the protection scope and disclosure scope of the present invention.

The invention claimed is:

1. A composite, wherein the composite comprises the following components:
   (1) from 30 to 70 parts by weight of a thermosetting mixture, comprising:
      (A) 75% to 95% by weight based on the total weight of components (A) and (B) of a thermosetting resin based on polybutadiene or a copolymer resin of polybutadiene and styrene having a molecular weight of 11,000 or less, being composed of carbon and hydrogen elements and containing 60% or more of vinyl groups, and
      (B) 5% to 25% by weight based on the total weight of components (A) and (B) of an ethylene-propylene diene methylene rubber having a weight-average molecular weight of greater than 100,000 and less than 120,000 and a number-average molecular weight of greater than 60,000 and less than 80,000, having an ethylene ratio of 65% or more and being in a solid state at room temperature;
   (2) from 10 to 60 parts by weight of a glass fiber cloth;
   (3) from 0 to 70 parts by weight of a powder filler; and
   (4) from 1 to 3 parts by weight of a curing initiator.

2. The composite claimed in claim 1, wherein the thermosetting mixture, the weight of the component A is from 75% to 92% by weight of the total weight of the components A and B; and the weight of the component B is from 8% to 25% by weight of the total weight of the components A and B.

3. The composite claimed in claim 1, wherein the thermosetting mixture further comprises other resin materials with unsaturated double bonds or unsaturated triple bonds.

4. The composite claimed in claim 3, wherein the other resin materials with unsaturated double bonds or unsaturated triple bonds are selected from the group consisting of a cyanate resin, a vinyl or an acrylic group-terminated polyphenylene ether resin, an allylated polyphenylene ether resin, a bismaleimide resin and a vinyl-terminated silicone resin, or a mixture of at least two selected therefrom.

5. The composite claimed in claim 1, wherein the powder filler is selected from the group consisting of a crystalline silica, a fused silica, a spherical silica, a titania, a strontium titanate, a barium titanate, a boron nitride, an aluminum nitride, a silicon carbide, an alumina, a glass fiber, a polytetrafluoroethylene, a polyphenylene sulfide and a polyethersulfone, or a mixture of at least two selected therefrom.

6. The composite claimed in claim 1, wherein the curing initiator is selected from the group consisting of a dicumyl peroxide, a t-butyl peroxy benzoate and a 2,5-bis(2-ethylhexanoyl peroxide)-2,5-dimethylhexane, or a mixture of at least two selected therefrom.

7. The composite claimed in claim 1, wherein the composite further comprises a bromine-containing or a phosphorus-containing flame retardant.

8. The composite claimed in claim 7, wherein the bromine-containing flame retardant is selected from the group consisting of a decabromodiphenyl ether, a decabromodiphenyl ethane and an ethylene bistetrabromophthalimide, or a mixture of at least two selected therefrom.

9. The composite claimed in claim 7, wherein the phosphorus-containing flame retardant is selected from the group consisting of a tri-(2,6-dimethylphenyl)phosphine, a 10-(2,5-dihydroxyphenyl)-9,10-dihydro-9-oxa-10-phosphaphenanthrene-10-oxide, a 2,6-bis-(2,6-dimethylphenyl)-phosphinobenzene and a 10-phenyl-9,10-dihydro-9-oxa-10-phosphaphenanthrene-10-oxide, or a mixture of at least two selected therefrom.

10. The composite claimed in claim 1, wherein the composite further comprises an auxiliary crosslinking agent.

11. The composite claimed in claim 10, wherein the auxiliary crosslinking agent is selected from the group consisting of a triallyl trimeric isocyanate, a triallyl cyanurate, a divinylbenzene and a polyfunctional acrylate, or a mixture of at least two selected therefrom.

12. A laminate prepared from the composite claimed in claim 1, comprising a plurality of layers of superimposed prepregs, each of which is made of the composite.

13. A high-frequency circuit substrate prepared from the composite claimed in claim 1, comprising a plurality of layers of superimposed prepregs and copper foils pressed on both sides thereof, wherein each of the prepregs is made of the composite.

* * * * *